US006870371B2

(12) United States Patent
Park et al.

(10) Patent No.: US 6,870,371 B2
(45) Date of Patent: Mar. 22, 2005

(54) METHOD AND APPARATUS FOR EXAMINING PLASMA DISPLAY PANEL ELECTRODES USING FREQUENCY CHARACTERISTICS

(75) Inventors: Jae Hong Park, Kyungki-do (KR); Han Sang Lim, Seoul (KR)

(73) Assignee: Seoul National University, Seoul (KR)

( * ) Notice: Subject to any disclaimer, the term of this patent is extended or adjusted under 35 U.S.C. 154(b) by 0 days.

(21) Appl. No.: 10/603,731

(22) Filed: Jun. 25, 2003

(65) Prior Publication Data

US 2004/0090222 A1 May 13, 2004

(30) Foreign Application Priority Data

Jun. 27, 2002 (KR) ................................ 10-2002-0036264

(51) Int. Cl.[7] ................................ G01R 31/00
(52) U.S. Cl. ................................ 324/403
(58) Field of Search ................................ 438/14, 17, 20; 324/158.1, 403, 500, 501, 537, 555, 512, 520, 521, 527, 528, 534

(56) References Cited

U.S. PATENT DOCUMENTS 5,570,029 A 10/1996 Bottman et al.
2003/0001561 A1 1/2003 Yamaoka et al.

FOREIGN PATENT DOCUMENTS

KR 20010106963 7/2001

*Primary Examiner*—Evan Pert
(74) *Attorney, Agent, or Firm*—Renner, Otto, Boisselle & Sklar, LLP

(57) ABSTRACT

The present invention relates to a method and apparatus for examining Plasma Display Panel (PDP) electrodes using frequency characteristics, which can rapidly examine the PDP electrodes for defects and detect the positions thereof using frequency characteristics of signals passing through the PDP electrodes in the PDP. In the present invention, a ground plane is formed so that it does not directly come into contact with a plurality of target electrodes, and a transmission line is added to come into contact with one of the ends of the plural target electrodes. Thereafter, an examination signal having a plurality of different frequency signals which linearly vary is applied to one end of the transmission line. Peak values according to frequencies of an output signal output from the other end of the transmission line are detected and the detected output wave characteristics are analyzed, thus determining whether defects of the PDP electrodes exist.

20 Claims, 10 Drawing Sheets

METHOD AND APPARATUS FOR EXAMINING PLASMA DISPLAY PANEL ELECTRODES USING FREQUENCY CHARACTERISTICS

BACKGROUND OF THE INVENTION

1. Field of the Invention

The present invention relates generally to an apparatus for examining electrodes of a plasma display panel comprised of a plurality of electrodes for defects, and more particularly to a method and apparatus for examining plasma display panel electrodes using frequency characteristics, which can rapidly and inexpensively examine the electrodes for defects and detect the positions of defective electrodes by detecting frequency characteristic variation due to the generation of defects, such as disconnection and short of the electrodes.

2. Description of the Related Art

A Plasma Display Panel (PDP) is a flat panel display unit based on a gas discharge phenomenon, and has advantages in that it occupies a narrow space, has a wide viewing angle and light weight, and it easily implements various colors. Therefore, the PDP has been recognized as favorable one of devices for High Definition Televisions (HDTVs) and wall-mounted multimedia display apparatuses. Moreover, recently, with the increase of the size of display units, demands for PDPs have increased. Especially, since the PDP has a thickness equal to or less than 4 inches with respect to a screen size of 20 to 80 inches, the PDP is not restricted by space when it is installed. Thus, it is expected that demands for the PDPs will further increase.

Generally, a PDP comprises upper and lower panels combined with each other, a fluorescent material and electrodes printed on the panels. Further, since the PDP is designed in such a manner that each of the panels has a plurality of electrodes to obtain high resolution on a large screen and the sizes of the electrodes are very small, there is a higher danger of damage to the electrodes.

For example, in the case of a HDTV-level PDP, the number of horizontal electrodes is 5760, the number of vertical electrodes is 1080, and each of the PDP electrodes has a width of several hundred μm and a thickness of several hundred nm to several μm.

Moreover, since a high voltage of approximately 200V is applied to the PDP electrodes, the progress of damage to the electrodes is very fast even though only part of the electrodes are damaged.

Further, after the upper and lower panels are combined with each other, maintenance is difficult even though defects are found in the electrodes, so the assembled PDP itself must be discarded.

Therefore, in order to reduce production costs and improve quality of products when PDPs are produced, it is required that the PDP electrodes are examined for defects before the upper and lower panels are assembled to be combined.

A conventional PDP electrode examination method uses a vision system comprised of a plurality of line scan cameras and frame grabbers arranged in parallel to correspond to the size (width) of a target PDP. After upper and lower panels of the PDP are combined with each other, actual screen information, generated when a voltage is applied to PDP electrodes, is scanned by the plural line scan cameras to examine the electrodes for defects. Such a conventional examination method is disadvantageous in that, since the number of line scan cameras is in proportion to examination resolution and the size of the target PDP, system costs and examination time increase as the examination resolution and the size of the target PDP increase.

More specifically, the line scan cameras, which are core components of the vision system, each have a predetermined number of pixels. Currently, a maximum data output speed of the line scan cameras is 100 MHz, and a maximum examination speed per line thereof does not exceed 100 KHz. If such line scan cameras are used, the vision system requires an examination time above several tens of seconds per 40-inch PDP. Meanwhile, in the vision system, since the amount of output data is proportional to the examination resolution or the size of the target PDP, the examination time increases if the examination resolution or the size of the target PDP increases.

Further, in order to examine a large-scale PDP at high resolution, a vision system comprised of line scan cameras with high speed and high resolution is required. However, a line scan camera with high speed and high resolution is very expensive at the present time as much as several tens of million Korean Won.

Therefore, in the case of the vision system, in order to increase resolution by two times, an examination time must increase by four times or the number of line scan cameras must increase by two times. Thus, the vision system is problematic in that, when the PDP electrode examination is carried out using the vision system, an examination time or examination cost increases if the examination resolution or the size of the target PDP increases.

Besides the method using the vision system, there are methods using a magnetic sensor, a roller probe, an Integrated Circuit (IC) probe and the like. These methods are disadvantageous in that, since all of the methods perform examination while moving a sensor or probe on a PDP, a scan area increases with the increase of a PDP size to increase an examination time, and PDP electrode regions may be damaged due to the contact with the sensor or probe.

SUMMARY OF THE INVENTION

Accordingly, the present invention has been made, keeping in mind the above problems occurring in the prior art, and an object of the present invention is to provide a method and apparatus for examining PDP electrodes using frequency characteristics, which can rapidly and inexpensively examine the PDP electrodes for defects and detect even positions of defective electrodes before a PDP is assembled, by measuring frequency characteristics of the PDP electrodes.

In order to accomplish the above object, the present invention provides a method of examining electrodes of a Plasma Display Panel (PDP) using frequency characteristics, the PDP being constructed so that upper and lower panels, on which a plurality of electrodes are horizontally or vertically printed, are combined with each other, the method comprising the steps of a) converting target PDP electrodes printed on each of the panels to a transmission line structure; b) applying an examination signal with a plurality of frequencies to the PDP electrodes converted to the transmission line structure and then detecting amplitudes and phases according to frequencies of an examination signal overlapped with a reflection wave reflected from a first end of a corresponding PDP electrode; and c) determining whether the PDP electrodes are defective by analyzing the detected amplitude and phase characteristics according to frequencies. Therefore, the present invention is advantageous in that it can easily examine the electrodes for defects and detect the positions of defective electrodes using the detected frequency characteristics without processing large-capacity data.

Preferably, in the PDP electrode examination method, the step a) may comprise the steps of attaching a conduction plate to a surface of the panel opposite to a surface on which the target PDP electrodes are printed, and grounding the attached conduction plate to form a ground plane. Further, the step a) may comprise the steps of forming an impedance adjustment layer made of dielectric material on a surface of the panel on which the target PDP electrodes are formed, attaching a conduction plate to a bottom of the impedance adjustment layer, and grounding the conduction plate and using the conduction plate as a ground plane. Further, the step a) may be performed so that the panel on which the target PDP electrodes are printed is floated on an electrically conductive liquid with high specific gravity to allow a surface of the panel on which the PDP electrodes are printed to face upward, and the liquid is used as a ground plane, thus converting the PDP electrodes to the transmission line structure. Moreover, the step a) may be performed so that two neighboring electrodes are set to each electrode pair with respect to the target PDP electrodes, and a first electrode of the electrode pair is set to a target electrode and a second electrode thereof is grounded according to set electrode pairs, thus converting the PDP electrodes to the transmission line structure.

Preferably, in the PDP electrode examination method, the step b) may be performed in such a way that a conduction line is provided to commonly come into contact with the plural PDP electrodes printed on a single panel, thus enabling the examination to be carried output using the PDP electrodes as stubs. Further, the step b) may be performed so that an examination signal is applied to a first end of each of the plurality of target PDP electrodes, and, simultaneously, frequency and phase characteristics of an output wave are detected through the first end thereof to which the examination signal is applied. In this manner, the PDP electrodes may be used as a transmission line to perform the examination.

Preferably, in the PDP electrode examination method, the examination signal applied at the step b) includes a plurality of frequency signals having a frequency interval (Δf), which is indicated in the following equation $$\Delta f = \frac{\Delta L}{4L(L-\Delta L)} \cdot \frac{c}{\sqrt{\varepsilon_r}},$$

where L is a length of a PDP electrode, ΔL is a length variation of the PDP electrodes to be discriminated, c is a propagation speed of light, and $\epsilon_r$ is relative permittivity of a dielectric material forming a transmission line. In this manner, examination resolution and precision can be adjusted by adjusting the interval between the frequencies of the examination signal.

Preferably, in the PDP electrode examination method, the step c) is performed so that positions of minimum points are checked from frequency characteristic results detected at the step b), and it is determined that defects are generated on the target PDP electrodes if the checked positions of the minimum points are different from those of minimum points previously set in a normal state, thus examining the PDP electrodes for defects. Further, the step c) may be performed so that positions of defective electrodes are detected using frequencies having minimum points obtained from the frequency characteristic results detected at the step b). Moreover, the step c) may be performed so that the number of defective electrodes is determined using the number of minimum points obtained from the frequency characteristic results detected at the step b) and amplitudes at the minimum points.

Preferably, in the PDP electrode examination method, the positions of defective electrodes may be detected by examining electrodes determined to be defective at the step c) using a vision system, thus reducing a load of the vision system.

In addition, the present invention provides an apparatus for examining PDP electrodes using frequency characteristics, comprising a target Plasma Display Panel (PDP) on which target electrodes are printed and a ground plane is formed to be spaced apart from the electrodes to convert the electrodes to a transmission line structure, and to which a conduction line is attached to come into contact with all of the electrodes; a signal generator for generating an examination signal including a plurality of frequency signals; a first impedance converter for matching impedance between the signal generator and the conduction line of the target PDP, and transmitting the examination signal to a first end of the conduction line; a peak detector for measuring amplitudes according to frequencies of an output wave output from a second end of the conduction line through the target electrodes; and a second impedance converter for matching impedance between the second end of the conduction line and the peak detector and transmitting the output wave to the peak detector without reflection.

In addition, the present invention provides an apparatus for examining PDP electrodes using frequency characteristics, comprising a target PDP on which target electrodes are printed and a ground plane is formed to be spaced apart from the electrodes to convert the electrodes to a transmission line structure; a plurality of signal generators for generating examination signals each including a plurality of frequency signals; a plurality of first impedance converters disposed between the signal generators and the target electrodes printed on the PDP, respectively, to apply corresponding examination signals to the respective target electrodes while matching impedance between the signal generators and the target electrodes; a plurality of peak detectors for measuring amplitudes according to frequencies of respective output waves output from the target electrodes printed on the PDP; and a plurality of second impedance converters disposed between the target electrodes and the peak detectors, respectively, to transmit the output waves to the peak detectors without reflection.

In addition, the present invention provides an apparatus for examining PDP electrodes using frequency characteristics, comprising a target PDP on which target electrodes are printed and a ground plane is formed to be spaced apart from the electrodes to convert the electrodes to a transmission line structure; a signal generator for generating an examination signal including a plurality of frequency signals; a first impedance converter disposed between the signal generator and the target electrodes printed on the PDP to transmit the examination signal to the target electrodes without reflection; a peak detector for measuring amplitudes according to frequencies of output waves output from the target electrodes printed on the PDP; a second impedance converter disposed between the target electrodes and the peak detector to transmit the output waves to the peak detector without reflection; and a switch for connecting both the first and second impedance converters to one selected among the plurality of target electrodes.

In addition, the present invention provides an apparatus for examining PDP electrodes using frequency characteristics, comprising a target PDP on which a plurality of target electrodes are printed; one or more switches respectively connected to adjacent electrodes printed on the PDP to alternately connect a corresponding electrode to first and second selection terminals of each of the switches, the second selection terminal being grounded; one or more signal generators for generating examination signals each including a plurality of frequency signals, the signal generators being connected to first selection terminals of the switches, respectively; a first impedance converter disposed between the signal generators and the target electrodes to transmit the examination signals to the target electrodes without reflection; a peak detector connected to the first selection terminals of the switches to measure amplitudes according to frequencies of output waves of the target electrodes, input through a corresponding switch; and a plurality of second impedance converters disposed between the target electrodes and the peak detector to transmit the output waves to the peak detector without reflection.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, embodiments of the present invention will be described in detail with reference to the attached drawings.

Stub Examination

For ease of understanding the examination principles of an apparatus for examining PDP electrodes for defects according to the present invention, a method of examining a stub of a transmission line is described.

Figure 1:
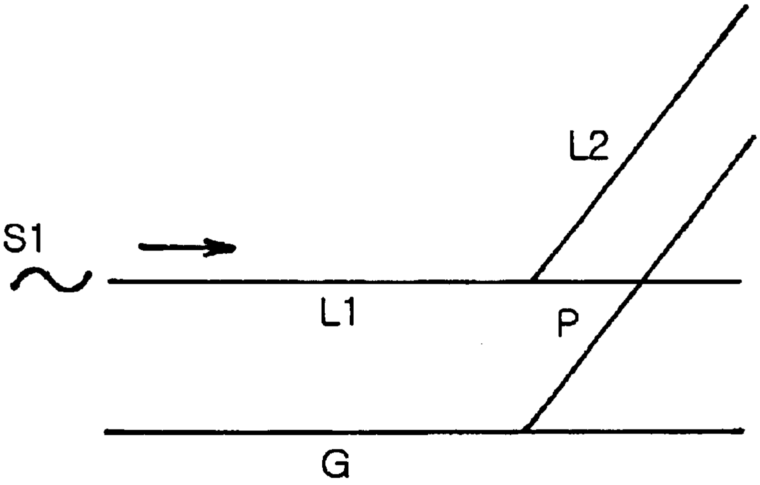
FIG. 1 is a view showing a transmission line having a stub.

FIG. 1 is a view showing a transmission line having a stub. If a signal S1 is applied to a transmission line L1, part of the signal S1 progressing along the transmission line L1 continues to be transmitted along the transmission line L1 at a branch point P, and the remaining part thereof is applied to a stub L2. At this time, the signal applied to the stub L2 progresses for a while and then is reflected from an end of the stub L2 due to discordance between characteristic impedance of the stub L2 and impedance of the end.

At this time, if the end of the stub L2 is disconnected, the signal is reflected without phase variation, while if the end thereof is shorted, the signal is reflected with the phase thereof shifted by 180°.

As described above, a reflection wave reflected from the end of the stub L2 progresses toward the branch point P and overlaps with the signal S1 progressing along the transmission line L1, and the overlap signal is output to an output terminal of the transmission line L1.

The reflection wave, which was reflected from the end of the stub L2 and had reached the branch point P, has a time delay with respect to the input wave S1. The time delay corresponds to a time required to move and return to/from the end of the stub L2 on the basis of the branch point P, that is, 'progressing distance/progressing speed'. In this case, since the progressing distance is a distance by which the signal moves and returns to/from the end of the stub L2 on the basis of the branch point P, it is two times the length of the stub L2. Therefore, the reflection wave has a phase difference corresponding to the delay time with respect to the input wave, and an output wave obtained by overlapping the two waves shows different characteristics depending on the delay time.

Especially, if the input wave S1 is a sine wave, the output wave output from the transmission line L1 is a result obtained by overlapping two sine waves having a phase difference proportional to the length of the stub L2 therebetween. Thus, the amplitude of the output wave is measured to determine the existence of a stub on a transmission line and the length of the stub.

Figure 2:
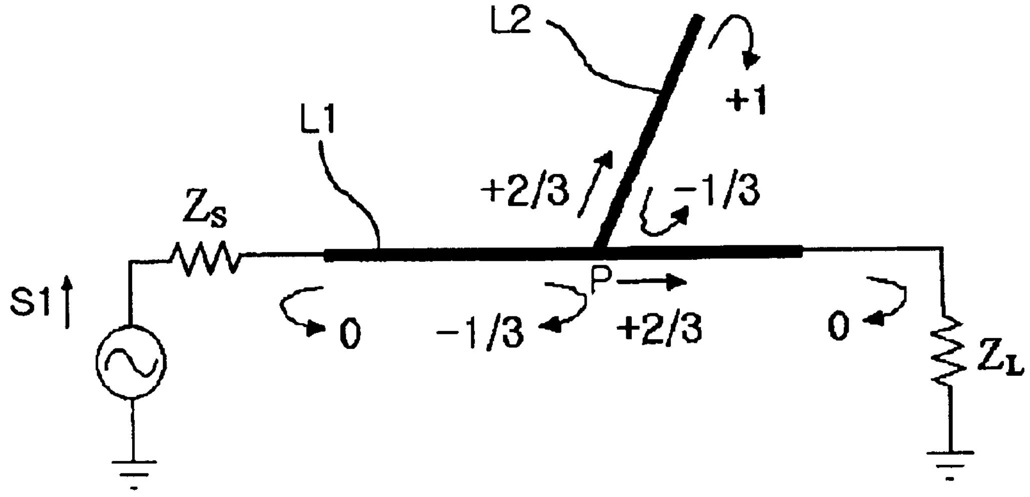
FIG. 2 is a view showing a relationship between the transmission and reflection of a signal on a transmission line having a stub.

FIG. 2 is an equivalent circuit showing signal characteristics of the transmission line having the stub of FIG. 1. A case where a sine wave is used as the input wave S1 input to the transmission line L1 is considered with reference to FIG. 2. In this case, assuming that impedances of the transmission line L1 and the stub L2 are equal, the amplitude of the input sine wave is A, and the frequency thereof is ω, the amplitude of a wave input to the stub L2 from the branch point P of FIG. 2 is ⅔ of the amplitude of the wave input to the transmission line L1. Therefore, the sine wave input to the stub L2 becomes "$(2A/3)\sin \omega t$", and the reflection wave varies according to the states of the end of the stub L2. Provided that the time delay of the reflection wave is $\Delta t$, the reflection wave reaching the branch point P becomes "$(2A/3)\sin \omega(t+\Delta t)=(2A/3)\sin(\omega t+\omega\Delta t)$" if the state of the end of the stub L2 is a disconnected state, so that a phase difference $\theta$ between the two waves becomes "$\omega\Delta t$". Further, if the state of the end of the stub L2 is a shorted state, the reflection wave reaching the branch point P becomes "$-(2A/3)\sin\omega(t+\Delta t)=(2A/3)\sin(\omega t+\omega\Delta t+\pi)$", so that a phase difference θ between the two waves becomes '$\omega\Delta t+\pi$'.

In FIG. 2, since an output wave between both ends of $Z_L$ is obtained by overlapping the input wave and the reflection wave, the amplitude of the output wave is determined depending on a phase difference between the two waves. If the phase difference is an odd number times π, the polarity of the reflection wave is opposite to that of the input wave, thus enabling the two waves to cancel each other. That is, if $\omega\Delta t$ and $\omega\Delta t+\pi$ are odd number times π at the disconnected stub and the shorted stub, respectively, the two waves cancel each other to cause the amplitude of the output wave to be approximately '0'. For example, if the stub is disconnected, an output wave Vo(t), in which the attenuation of a signal is ignored, becomes $$V_0(t)=\frac{2}{3}A\sqrt{2+2\cos(\omega\Delta t)\sin(\omega t+\phi)},$$

and it can be seen that the amplitude of the output wave is a function of the phase difference $\omega\Delta t$ from the above equation. Since a cosine function has a minimum value of −1 when a phase is $2(n-1)\pi$, the amplitude of the output wave has a minimum value if $\omega\Delta t$ is $2(n-1)\pi$. Such a phase difference is determined by the frequency of a sine wave and a time delay, and the time delay is determined by the progressing speed of the sine wave and the length of a stub, as described above. With respect to a stub having a certain length, a phase difference is an odd number times π at only specific frequencies, so that the input wave and the reflection wave cancel each other. Therefore, an input wave is applied while the frequency thereof is varied, and an overlap signal of the reflection wave and the input wave is detected to measure frequencies at which the amplitudes of the reflection and input waves cancel each other, thus determining the length of the stub.

Next, a relationship between the length of the stub L2 and the amplitude of the output wave of the transmission line L1 is described below. Assuming that the length of the stub L2 is L and the stub is a disconnected stub, a condition where sine waves overlapped by a time delay due to the stub L2 cancel can be expressed by Equation [1] if n is a natural number.

$$\omega\Delta t=(2n-1)\pi \qquad [1]$$

In Equation [1], if the frequency of the signal is f, there is a relation '$\omega=2\pi f$', and if the progressing speed of the sine wave is $v_p$, there is a relation '$\Delta t=2L/v_p$'. If these relations are applied to Equation [1], the following Equation [2] is obtained.

$$\frac{4\pi fL}{v_p}=(2n-1)\pi \qquad [2]$$

The frequency f at which the input and reflection waves cancel each other due to a phase difference at the stub L2 having the length of L is derived from Equation [2], and expressed in the following Equation [3].

$$f=\frac{2n-1}{4L}v_p \qquad [3]$$

Further, provided that the speed of light in a vacuum is c and a relative permittivity of a dielectric forming the transmission line L1 is $\epsilon_r$, the progressing speed $v_p$ of the signal satisfies a relation $$v_p=\frac{c}{\sqrt{\varepsilon_r}}.$$

Figure 3:
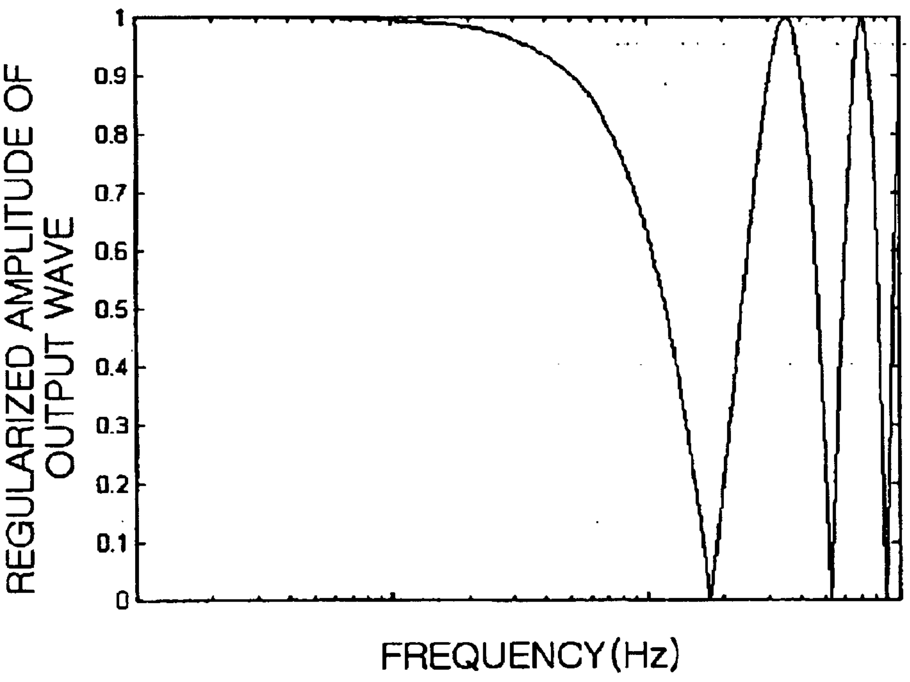
FIG. 3 is a graph showing output characteristics according to frequencies for a transmission line having a disconnected stub.

FIG. 3 is a graph showing regularized amplitudes according to frequencies of a sine wave output from a transmission line having a stub with a certain length. In FIG. 3, points at which the amplitude of the sine wave is approximately '0' can be ascertained, and it can be recognized from the points that the stub exists on the transmission line. The frequencies at which the amplitude is approximately '0', are values obtained by applying n=1, 2, 3, . . . to Equation [3], and determined by the length of the stub.

If frequency characteristics as shown in FIG. 3 are measured for the transmission line, the length of the stub can be determined. In order to measure the length of the stub, if n=1 is applied to Equation [3] and then Equation [3] is arranged about L, the length of the stub is obtained as Equation [4], $$L=\frac{c}{4f\sqrt{\varepsilon_r}} \qquad [4]$$

where f is a first frequency at which cancellation occurs, that is, the lowest frequency. Therefore, frequency characteristics are measured for the transmission line, so that it can be determined whether a stub exists on a transmission line on the basis of the determination of whether there is a position at which amplitudes cancel. If there is a position at which the amplitudes cancel, the length of the stub can be determined from a minimum frequency at which the cancellation occurs.

If the end of the stub is disconnected, the phase of the reflection wave does not change, while if the end thereof is shorted, the phase of the reflection wave varies changes by 180°. Thus, frequency characteristics can vary according to states of the end of the stub even for a single target to be measured.

Output Wave When End of Stub is Disconnected

Disconnection represents a state in which impedance is infinite. Therefore, if the end of the stub is disconnected, output impedance of the transmission line is characteristic impedance of the transmission line, and an output wave is shown in FIG. 3. Further, a relation between the length of the stub and the frequency at which cancellation occurs complies with Equation [4].

Output Wave When End of Stub is Shorted

Figure 4:
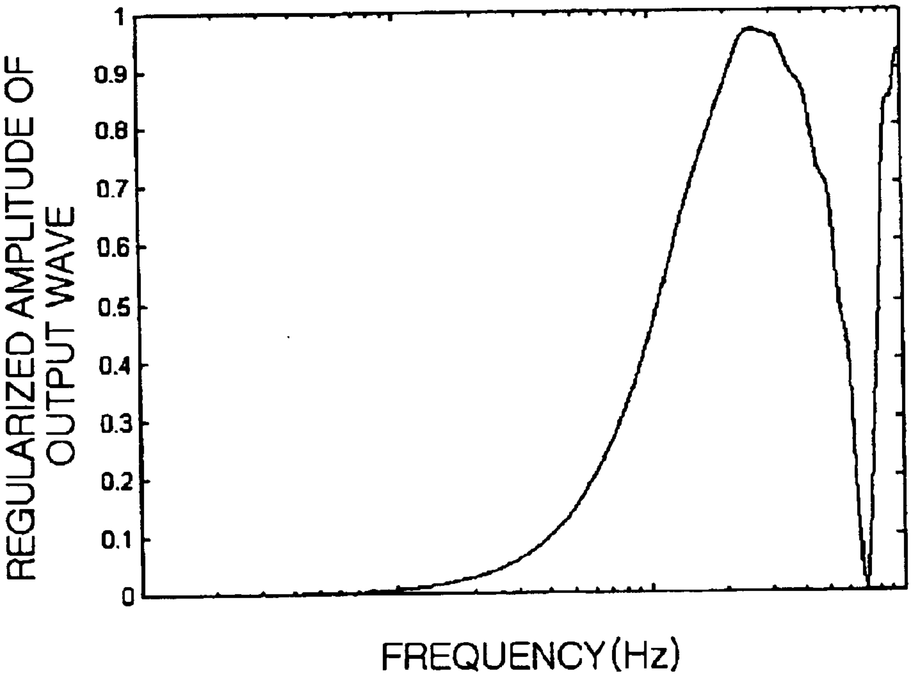
FIG. 4 is a graph showing output characteristics according to frequencies for a transmission line having a shorted stub.

Short represents a state in which impedance is '0'. Therefore, if the end of the stub is shorted, output impedance of the transmission line is '0' at a low frequency, and an output wave is shown in FIG. 4. That is, as recognized by the comparison of FIGS. 3 and 4, output waves obtained by the shorted stub and the disconnected stub are different from each other in low frequency characteristics. Further, it can be determined whether the stub is disconnected or shorted using the difference of the low frequency characteristics. Further, a phase difference obtained when the stub is shorted is '$\omega\Delta t+\pi$', so it can be expressed by Equation [5].

$$\omega\Delta t+\pi=(2n-1)\pi \qquad [5]$$

Additionally, a relation between the length of the stub and the frequency at which cancellation occurs is obtained as Equation [6] derived from Equation [5].

$$L = \frac{c}{2f\sqrt{\varepsilon_r}} \qquad [6]$$

Therefore, even in the case of the shorted stub, the length of the stub can be determined through the frequency characteristic measurement, similar to the case of the disconnected stub.

Output Wave When Two or More Stubs Exist

A frequency at which cancellation occurs is related to only the length of a stub, not a position where the stub exists on a transmission line. Therefore, a frequency at which cancellation occurs on a transmission line connected to a plurality of stubs having the same lengths is the same as that on a transmission line connected to a single stub. However, on a transmission line connected to a plurality of stubs having different lengths, there are a plurality of frequencies at which cancellation occurs, and among the frequencies, integer times are not satisfied. Properly, even on the transmission line connected to the plural stubs having the same lengths, there are a plurality of frequencies at which amplitudes cancel. However, in this case, there is a rule that the frequencies are equal to integer times a minimum frequency among the above frequencies.

That is, in the case of the disconnected stub, frequencies at which cancellation occurs satisfy the rule that the frequencies are odd number times a minimum frequency, as shown in Equation [3]. Further, in the case of the shorted stub, frequencies at which cancellation occurs satisfy the rule that the frequencies are integer times a minimum frequency, as shown in Equation [5]. Therefore, the number of frequencies not satisfying the above rule is equal to the number of stubs having different lengths. For example, as a result of measuring frequency characteristics over a frequency range of 0 to 2 GHz on a transmission line with disconnected stubs, it can be recognized that the transmission line has two stubs with the lengths of 8 cm and 12 cm, respectively, if cancellation occurs at frequencies of 300 MHz, 450 MHz, 900 MHz, 1350 MHz, and 1500 MHz.

Further, if there are a plurality of stubs having the same lengths, the number of stubs can be determined using the amplitude of an output wave. Assuming that interference between stubs is ignored, a cancellation degree is proportional to the number of stubs having the same lengths. Further, generally, an interval between stubs is not large enough to ignore interference therebetween. However, if the number of stubs having the same lengths increases, a cancellation degree of input and reflection waves increases, so the amplitude of the output wave decreases. Consequently, even though a plurality of stubs having the same lengths exist, the length and the number of stubs can be determined using cancellation frequencies and cancellation degree of the output wave.

Hereinafter, a method and apparatus for examining PDP electrodes for defects is described using the above-described stub examination principles.

Construction of PDP

Figure 5:
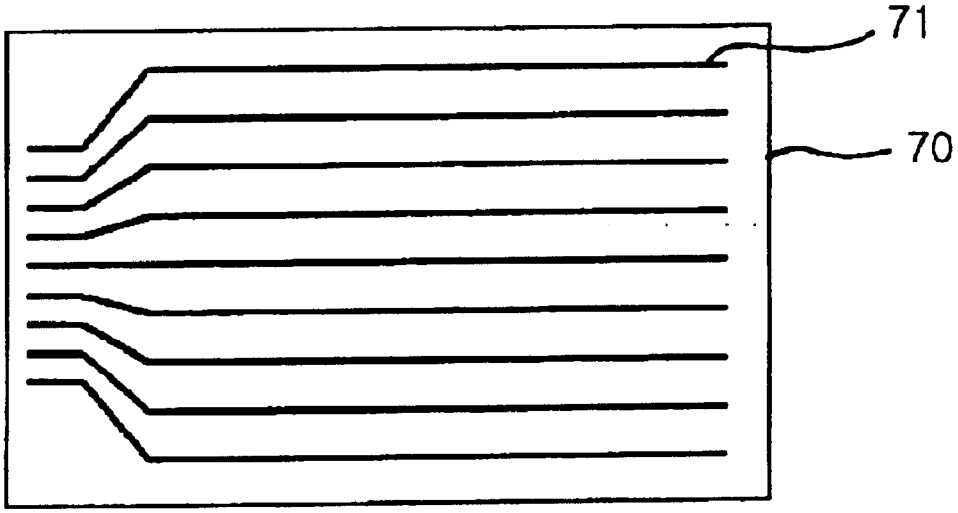
FIG. 5 is a view showing the basic construction of a PDP.

FIG. 5 is a view showing the basic construction of a PDP. As shown in FIG. 5, the PDP comprises upper and lower panels each constructed in such a way that a plurality of parallel electrodes 71 are printed on a glass plate 70. Printed patterns of electrodes, materials thereof, dimensions and the like vary depending on production companies and the upper and lower panels, but they are generally constructed as shown in FIG. 5.

However, since the above-described examination method using frequency characteristics uses the reflection of a signal due to impedance variation at electrodes, impedances of the electrodes must be uniformly maintained regardless of the positions thereof, and influence due to impedance variation must be easily found. In the present invention, the structure of PDP electrodes must be converted to a transmission line structure (microstrip line, strip line, coaxial cable, twisted pair or the like) at the time of examination so as to apply the examination method using frequency characteristics to the PDP electrodes.

Figure 6:
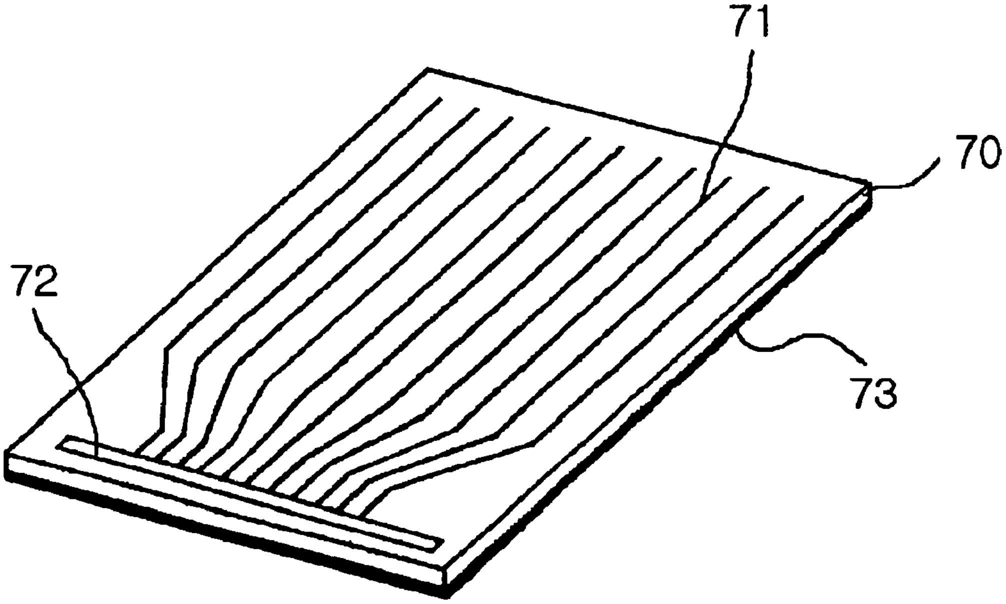
FIG. 6 is a view showing PDP electrodes converted to a microstrip line structure according to the present invention.

FIG. 6 is a view showing an example in which the structure of PDP electrodes is converted to a microstrip line structure. As shown in FIG. 6, a conduction plate 73 functioning as a ground plane is additionally provided on a surface of the glass plate 70 opposite to a surface on which the electrodes are printed, and a conduction line 72 is connected to the plural PDP electrodes 71 to come into contact with the PDP electrodes 71. Thus, the conduction line 72 functions as a transmission line, the plural PDP electrodes function as stubs, and the glass plate 70 functions as a dielectric material, so that an electrode examination using frequency characteristics can be performed.

Figure 7A:
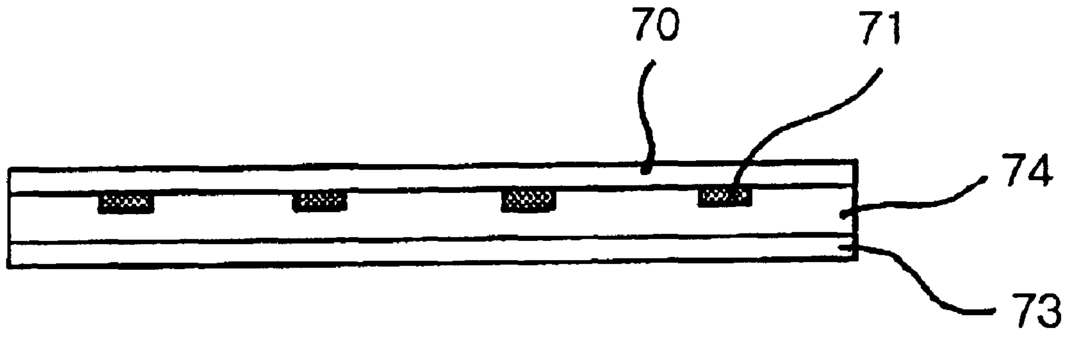
FIGS. 7A and 7B are sectional views showing an impedance adjustment structure for examining PDP electrodes for defects in the present invention.
Figure 7B:
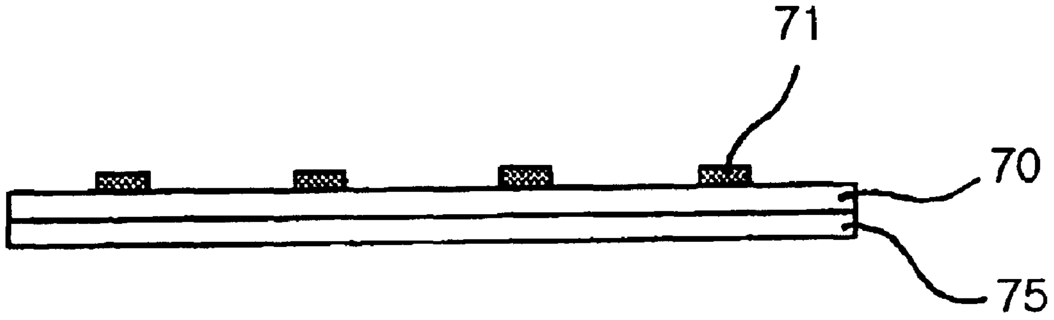

Conversion of PDP Electrodes to Transmission Line Structure and Impedance Adjustment FIGS. 7A and 7B are sectional views of a PDP converted to a transmission line structure to perform an examination according to the present invention.

Referring to FIG. 7A, a dielectric layer 74 made of dielectric material is attached to the surface of the glass plate 70 on which the PDP electrodes 71 are printed, and a conduction plate 73 functioning as a ground plane is attached to the bottom of the dielectric layer 74. In this structure, impedance of the electrodes can be adjusted by adjusting the type of dielectric material of the dielectric layer 74 and the thickness thereof. The PDP electrodes 71 correspond to stubs.

Alternatively, as shown in FIG. 7B, a conduction plate 75 functioning as a ground plane is formed on the surface of the glass plate 70 opposite to the surface on which the PDP electrodes 71 are printed. At this time, a metal plate can be used as the conduction plate 75. However, instead of the conduction plate 75, an electrically conductive liquid with high specific gravity, such as mercury, can be used. In the latter case, the glass plate 70 is floated on the electrically conductive liquid with high specific gravity, such as mercury, to allow the PDP electrodes 71 to face upward, thus enabling the liquid to be used as the ground plane. In this case, the glass plate 70 functions as a dielectric layer, and the conduction plate or the liquid with high specific gravity, such as mercury, functions as the ground plane, thus forming a transmission line structure.

In the transmission line structure as converted above, the impedance of the PDP electrodes can be adjusted by adjusting the type of dielectric material, the thickness of a dielectric layer, and the thickness of an added condition line. Moreover, a method using a pressure adjusting device, such as an air pump, can be used as one of other impedance adjustment methods. That is, the thickness of an air layer between PDP electrodes and a around plane is adjusted using the air pump, without inserting a dielectric material between the PDP electrodes and the ground plane, so that air having a relative permittivity of 1 is used as the dielectric material. Consequently, the thickness of this air layer is adjusted, thus forming a transmission line structure in which impedance is adjusted.

As described above, the ratio of signals branched at a branch point to an input signal is determined depending on a ratio of impedance of the PDP electrodes to impedance of the conduction line. Consequently, influence of the PDP electrodes on the entire output signal is determined depending on the ratio of impedance of the PDP electrodes to impedance of the conduction line.

Hereinbefore, the ground plane is added to allow the PDP electrodes to be converted to the transmission line structure. Besides this method, the PDP electrodes can be converted to the transmission line structure using characteristics that any two PDP electrodes are parallel to each other and are arranged at regular intervals. Since all PDP electrodes are arranged in parallel at regular intervals, impedance between two electrodes is maintained to be constant. Therefore, any two PDP electrodes are selected, so one of them is used as a target transmission line to which a signal is applied, and the other thereof is used as a line for a ground signal. In this way, target electrodes are converted to a transmission line structure.

Application of Examination Signal and Detection

If the PDP electrodes are converted to the transmission line structure using the above-described methods, a sine wave is applied to the PDP electrodes while the frequency of the sine wave is varied, and frequency characteristics of an output wave, obtained after the sine wave is applied, are detected. At this time, a frequency characteristic curve of the detected output wave has minimum points at frequencies corresponding to the lengths of the PDP electrodes.

Figure 8:
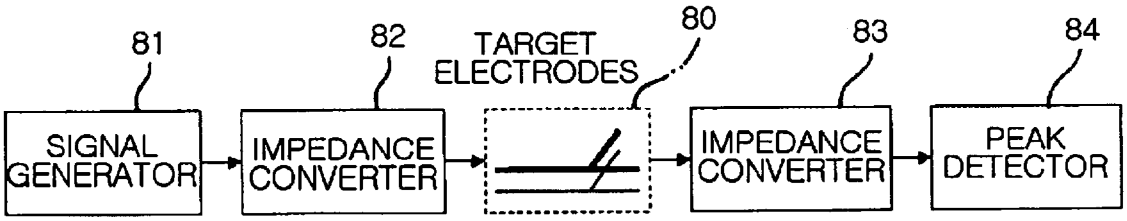
FIG. 8 is a block diagram of an apparatus to which a method of examining PDP electrodes according to the present invention is applied.

FIG. 8 is a block diagram of an apparatus for examining PDP electrodes converted to a transmission line structure for defects. As shown in FIG. 8, the PDP electrode examination apparatus of the present invention comprises target PDP electrodes 80 converted to the transmission line structure, a signal generator 80 for generating an examination signal having a plurality of frequencies, a first impedance converter 82 for transmitting the examination signal generated by the signal generator 81 to the target electrodes 80 without generating a reflection wave, a second impedance converter 83 for detecting an output signal of the target electrodes 80 without reflection, and a peak detector 84 for detecting frequency characteristics of the output signal of the target electrodes 80, applied through the second impedance converter 83.

The signal generator 81 generates a signal having a desired frequency and applies the signal to a target (PDP electrodes converted to a transmission line structure, or a conduction line added to come into contact with the PDP electrodes converted to the transmission line structure) through the first impedance converter 82. The first and second impedance converters 82 and 83 perform impedance matching to prevent reflection waves from being generated between the signal generator 81 and the target electrodes 80, and between the target electrodes 80 and the peak detector 84, respectively. Since output impedance of the signal generator 81 and input impedance of the peak detector 84 are equally 50 Ω, the characteristic impedance of the conduction line matches the impedance of 50 Ω. Therefore, if the characteristic impedance of the conduction line is 50 Ω, an impedance converter is not necessary. The peak detector 84 measures the amplitude of the output wave obtained when the input signal is applied to the target electrodes 80 and then passes through the target electrodes 80. The electrodes are examined for defects and the positions of defective electrodes are detected using measured amplitudes according to frequencies.

As shown in the above-described Equation [3], since cancellation occurs at only specific frequencies depending on the lengths of stubs, the input signal must be applied while the frequency thereof is varied so as to determine the lengths of target PDP electrodes corresponding to stubs. Therefore, the signal generator 81 applies the examination signal having different frequencies to the target electrodes 80. At this time, as an interval between the frequencies of the examination signal becomes small, a difference between the lengths of electrodes, which can be discriminated, becomes small. Further, as a signal with a higher frequency is applied, even an electrode having a smaller length can be detected. Therefore, as an interval between the frequencies of the examination signal becomes small, the precision of the measured lengths of the electrodes is improved. Further, as the frequencies of the applied examination signal become high, the range of the electrode lengths, which cannot be detected, becomes narrow.

Besides the above components, in order to measure the amplitudes of respective waves while varying the frequency of the examination signal, a control means for controlling the measurement of the amplitudes of respective waves, and a memory for storing driving programs and measured wave amplitudes data therein, can be added.

Examination of PDP Electrodes for Defects

Figure 9:
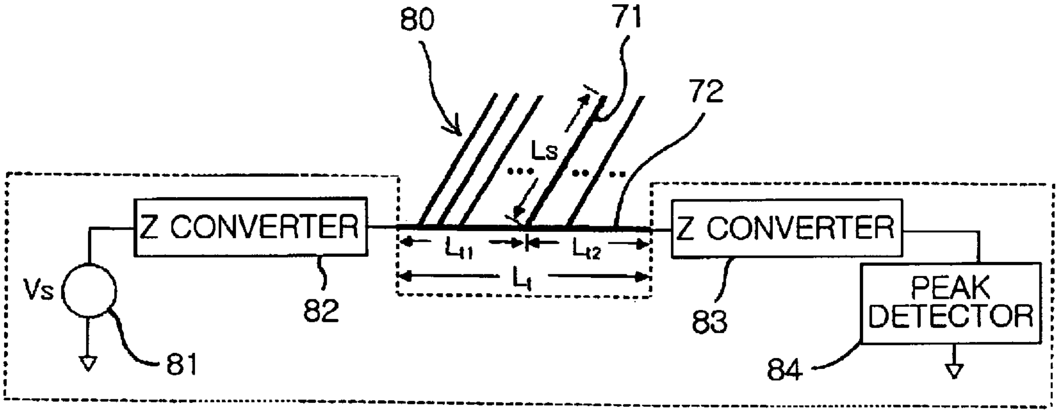
FIG. 9 is a circuit diagram of an apparatus for examining PDP electrodes according to an embodiment of the present invention.

FIG. 9 is a view showing the construction in which an examination apparatus is connected to PDP electrodes to examine the PDP electrodes for defects. In this case, an examination signal is applied to the conduction line 72 added to come into contact with all PDP electrodes 71. In order to examine the PDP electrodes for defects, input and output terminals of the conduction line 72 are connected in series with the impedance converters 82 and 83 of the examination apparatus, respectively, between the impedance converters 82 and 83. Further, a sine wave is applied to the conduction line 72 while the frequency thereof is varied through the signal generator 81. The amplitude of a signal output from the conduction line 72 is measured by the peak detector 84. A frequency characteristic curve measured in this way has minimum points where cancellation occurs at frequencies corresponding to the lengths Ls of the respective PDP electrodes 71.

Defects of the PDP electrodes are generally generated in the form of disconnection of electrodes or partial disconnection thereof. Such defects cause the variation of the impedance of electrodes. Therefore, the reflection of a signal occurs at a position where a defect of the PDP electrode is generated, thus varying frequency characteristics. Using these frequency characteristics, it can be determined whether defects of PDP electrodes are generated.

Analysis of Lengths of Defective Electrodes

In FIG. 9, it is assumed that one electrode is disconnected at its center and so the length thereof changes while the conduction line is added to allow all of the electrodes to have the same lengths.

Figure 11A:
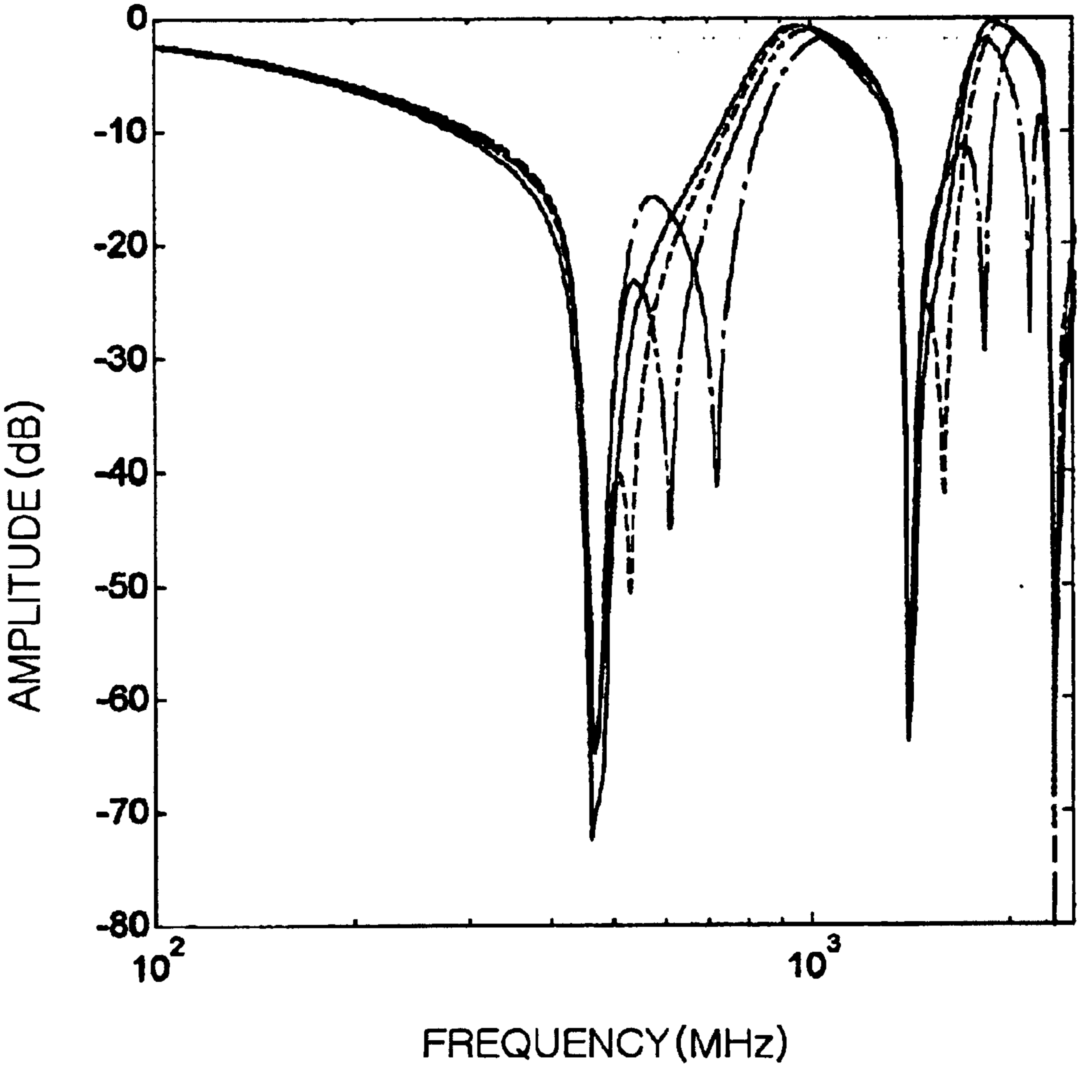
FIGS. 11A and 11B are graphs respectively showing a relationship between the length variation of one electrode of the PDP electrodes and frequency characteristic variation thereof, and a relationship between the variation of the number of defective PDP electrodes and frequency characteristic variation thereof in the PDP electrode examination of the present invention.

In this case, as shown in FIG. 11A, additional minimum points are generated at frequencies corresponding to the length of the disconnected electrode. Therefore, the existence of a defective electrode and the length thereof can be determined using the frequencies of the additionally generated minimum points compared to a normal frequency characteristic curve. In FIG. 11A, a curve represented by a solid line is a frequency characteristic curve of a normal PDP without defects, and curves represented by a dotted line, a one-dot chain line and a two-dot chain line are frequency characteristic curves of a PDP including defective electrodes having different disconnected positions. As compared in the curves of FIG. 11A, the existence of a defective electrode can be determined according to whether additional minimum points exist. Further, the frequencies at which the additional minimum points are generated are varied depending on the length of a defective electrode, as shown in Equation [4], thus determining the length of the defective electrode.

Analysis of the Number of Defective Electrodes

Figure 11B:
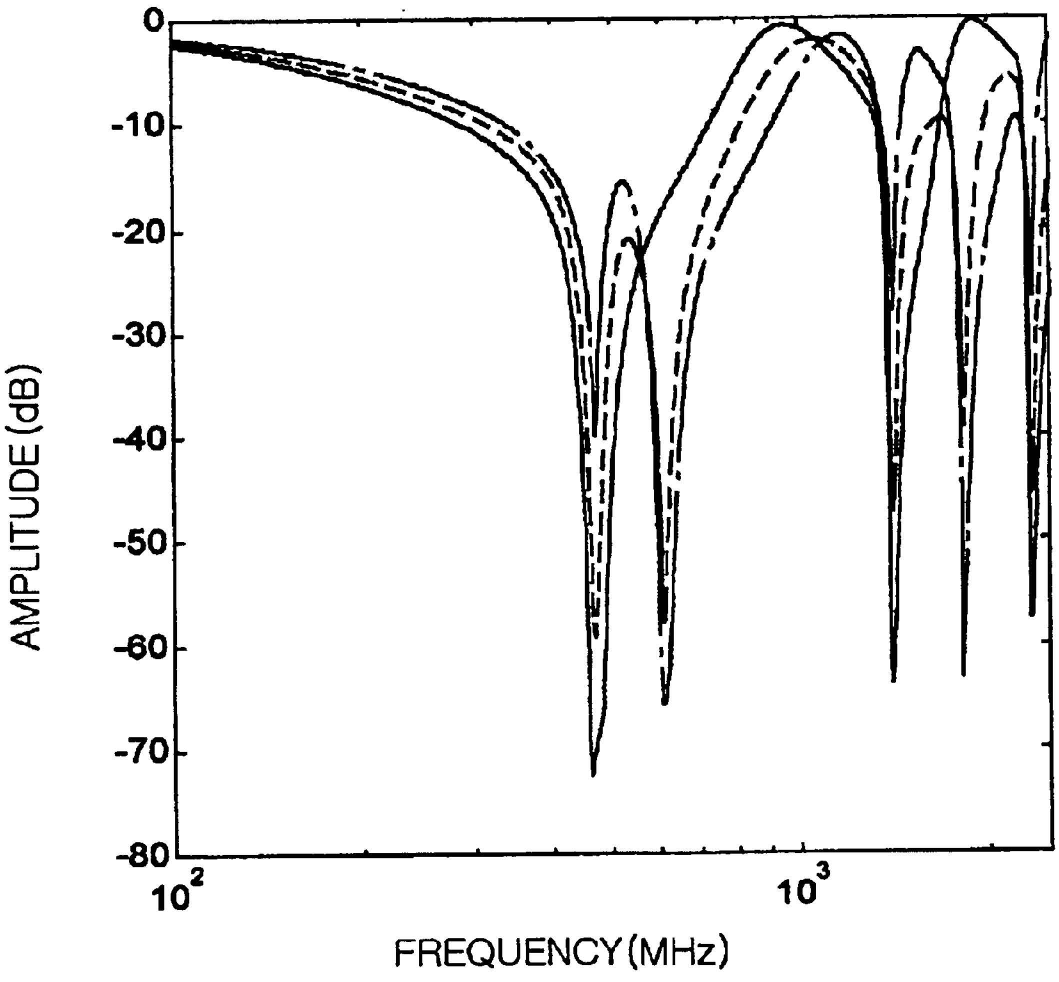

In FIG. 9, it is assumed that a plurality of defective electrodes exist and they have different disconnected lengths while the conduction line is added to allow the plurality of electrodes to have the same lengths. This situation corresponds to a case in which stubs having different lengths exist, so a plurality of minimum points are generated at different frequencies. Therefore, by measuring the number of minimum points, the number of defective electrodes can be determined. Further, if there are a plurality of defective electrodes having the same lengths, amplitudes at minimum points are measured to determine the number of defective electrodes having the same lengths. FIG. 11B is a graph showing frequency characteristic variations according to the number of defective electrodes having the same lengths. In FIG. 11B, a curve represented by a solid line is a frequency characteristic curve when the lengths of all PDP electrodes are equal, that is, when all PDP electrodes are normal. Further, a curve represented by a dotted line is a frequency characteristic curve when two defective electrodes having the same lengths exist, and a curve represented by a two-dot chain line is a frequency characteristic curve when four or more defective electrodes having the same lengths exist. As shown in FIG. 11B, as the number of defective electrodes having the same lengths increases, amplitudes at minimum points decrease at the same frequency. Therefore, as described above, by comparing amplitudes at minimum points with each other, the number of defective electrodes having the same lengths can also be determined.

Selection of Interval Between Frequencies of Examination Signal

As shown in Equations [4] and [6], a frequency at which cancellation occurs is in inverse proportion to the length of a stub. Even at the same length difference ΔL, the variation range of a cancellation frequency changes depending on the length of a stub. Generally, if a stub is long, the variation of the cancellation frequency to the same length variation is smaller than that of a shorter stub. Therefore, in order to obtain equal longitudinal resolution and high examination speed regardless of the lengths of stubs, an interval between the frequencies of the applied examination signal must be adjusted according to the length L of a stub to be examined.

That is, if the length variation of ΔL is required to be discriminated for a stub having the length of L, an interval between the frequencies of the examination signal to be applied is obtained below.

In the case of a disconnected stub, provided that a cancellation frequency on a stub having the length of L is f1 and a cancellation frequency on a stub having the length of L−ΔL is f2 (=f1+Δf), a difference Δf between two frequencies f1 and f2 is expressed by Equation [9] derived from Equation [4], $$\Delta f = \frac{\Delta L}{4L(L-\Delta L)} \cdot \frac{c}{\sqrt{\varepsilon_r}} \quad [9]$$

where L is the length of the stub, ΔL is the length variation of the stub (that is, PDP electrode) to be discriminated, Δf is the interval between applied frequencies, c is the propagation speed of light, and $\epsilon_r$ is the relative permittivity of a dielectric material forming a transmission line.

Embodiments

When PDP electrodes are examined according to the present invention, only examination of electrodes for defects can be performed for the purpose of performing a rapid inspection. Further, both the examination of electrodes for defects and the detection of the positions of defective electrodes can be performed together for a precise inspection.

Even in the case where only the examination of electrodes for defects is performed, the lengths of defective electrodes can be determined, and a rapid examination is possible and an examination time can be reduced compared to a case where the positions of defective electrodes are required to be detected. Further, when the PDP electrodes are converted to a transmission line structure using a ground plane, there can be used two methods, that is, a method using the PDP electrodes as stubs connected to a transmission line and a method using the PDP electrodes as a transmission line.

Figure 10A:
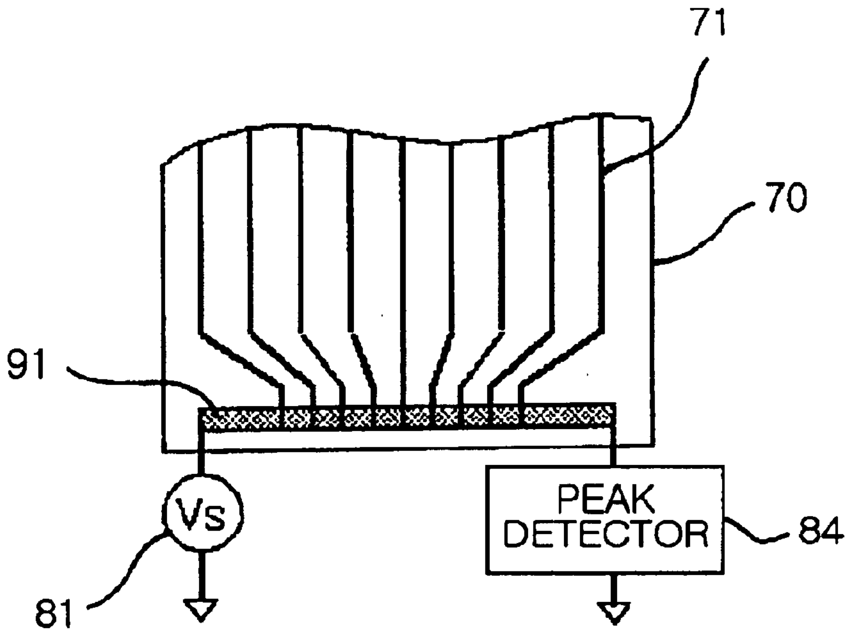
FIGS. 10A and 10B are views showing examples of a structure for examining the PDP electrodes for defects in the PDP electrode examination method of the present invention.

FIG. 10A is a view showing an example of an examination method according to the present invention, wherein an separate conduction line (transmission line) to which a signal is applied is added, and PDP electrodes are used as stubs connected to the transmission line. In FIG. 10A, reference numeral 91 is the conduction line commonly connected to the PDP electrodes 71 printed on the glass plate 70 to apply a signal to the PDP electrodes 71. The PDP electrodes 71 are stubs connected to the conduction line 91. In this case, the peak detector 84 has the same input/output impedance as the conduction line 91. Further, in this method, characteristics of the added conduction line 91 (shape, characteristic impedance, the number of connected PDP electrodes and the like) are varied to obtain different wave characteristics. For example, actual lengths of the PDP electrodes are slightly different. However, when the conduction line 91 is added, the shape of the conduction line 91 can be adjusted so that the lengths ranging from a contact point of respective electrodes and the conduction line 91 to ends of respective electrodes are all equal. In this way, in the case where all electrodes lengths ranging from the contact point with the conduction line 91 to the ends of the electrodes are equal, the output waves become equal to that of a transmission line having a single stub if there are no defects on all PDP electrodes. Consequently, all of the output waves have minimum points at the same frequencies. On the contrary, if even one of the PDP electrodes is disconnected, a stub shorter than normal PDP electrodes is generated, so that an output wave has minimum values at frequency regions higher than those of a normal state. As described above, the output waves of the conduction line 91 are analyzed to rapidly examine the PDP electrodes for defects.

Figure 10B:
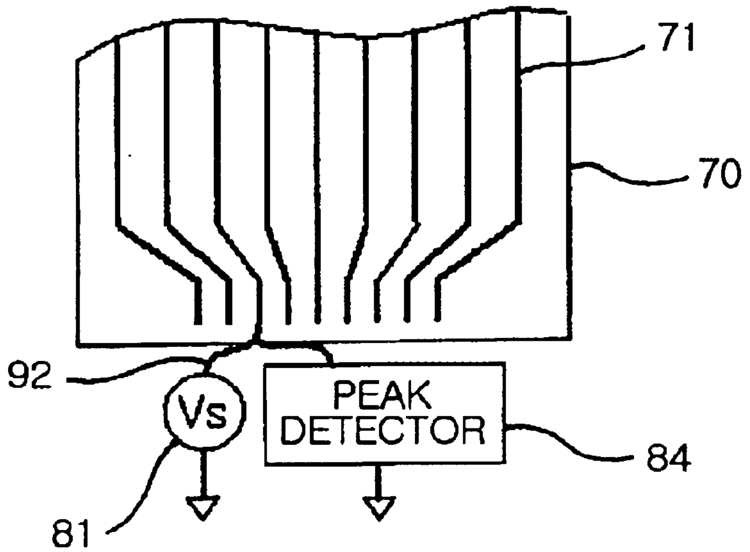

FIG. 10B is a view showing another example of an examination method according to the present invention, wherein the PDP electrodes 71 are used as the transmission line. In this embodiment, the signal generator 81 and the peak detector 84 are commonly connected to the target electrodes without using a conduction line. In this case, the peak detector 84 must have high impedance to realize impedance matching. The examination apparatus is constructed in a source termination manner. In this construction, an examination signal is applied to each of the PDP electrodes, and output waves thereof are analyzed, thus examining the PDP electrodes for defects.

Next, a method of examining PDP electrodes for defects and also detecting the positions of defective PDP electrodes is described.

When a conduction line for signal application is added to the PDP electrodes in a structure using a ground plane, the shape of the conduction line is adjusted so that the lengths ranging from the conduction line to ends of respective PDP electrodes are different according to electrodes by set values.

At this time, in order to obtain a higher examination speed at the same resolution, frequencies are preferably applied on a log scale. Further, the lengths of the electrodes are preferably adjusted so that frequency varies linearly on a log scale. In this case, if part of the target PDP electrodes are defective, a cancellation degree of frequencies corresponding to the lengths of the defective electrodes varies to easily detect electrode positions at which defects are generated. That is, a wave measured on perfect PDP electrodes is a reference wave, and cancellation frequencies on the reference wave and cancellation frequencies of waves measured on target electrodes are compared and analyzed to detect the positions of defective electrodes. This embodiment is advantageous in that, since the PDP electrodes are examined for defects and, simultaneously, the positions of defective electrodes are detected through single signal measurement and analysis, an examination speed is very high.

Figure 12B:
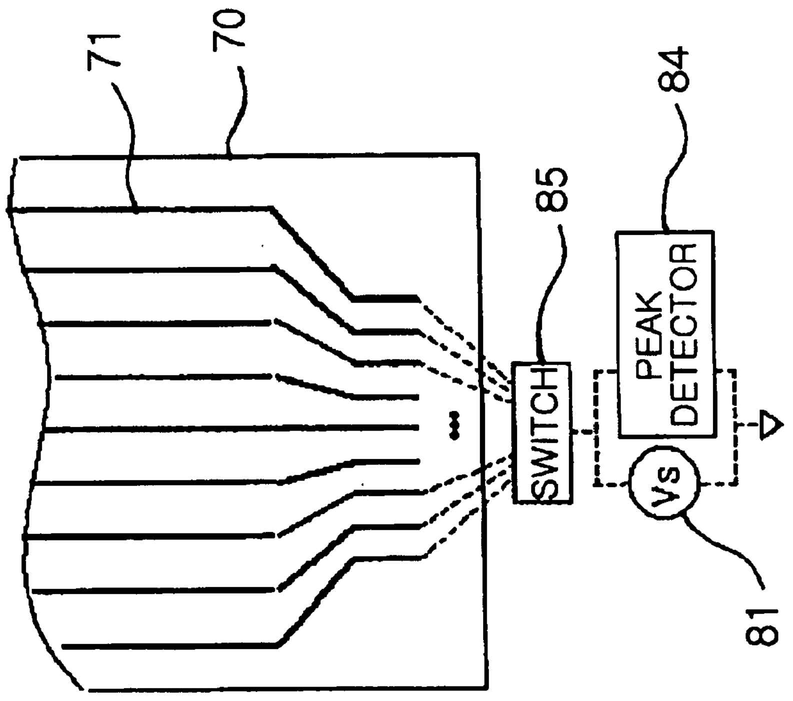
FIGS. 12A and 12B are views showing examples of a structure for detecting the positions of defective PDP electrodes in the PDP electrode examination apparatus of the present invention.
Figure 12A:
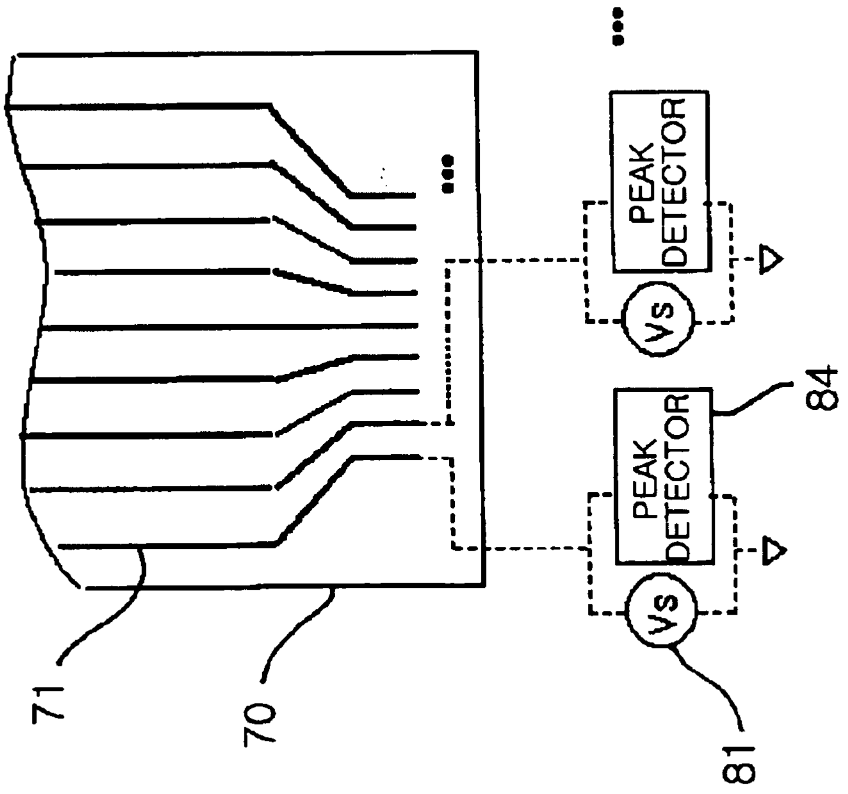

Further, as shown in FIG. 10B, even in the case where the PDP electrodes are used as the transmission line without using a conduction line, the examination is repeatedly performed according to electrodes, thus detecting defective electrodes. FIGS. 12A and 12B illustrate embodiments of an examination apparatus employing a method in which PDP electrodes are used as the transmission line.

The examination apparatus of FIG. 12A is constructed in such a way that a paired unit comprising a signal generator 81 and a peak detector 84 is connected to each of the PDP electrodes 71 to be parallel with other paired units. In this apparatus, the PDP electrodes are examined for defects and, simultaneously, the lengths of the defective electrodes are detected. Therefore, the examination apparatus is advantageous in that the positions and lengths of detective electrodes can be detected through a single measurement, and an examination speed is high.

The examination apparatus of FIG. 12B is constructed in such a way that both a single signal generator 81 and a single peak detector 84 are connected to one selected among the plural PDP electrodes 71 through a switch 85 (including a relay, multiplexer or the like). The examination apparatus sequentially examines the plural PDP electrodes 71. At this time, differently from the embodiment of FIG. 12A, the numbers of signal generators 81 and peak detectors 84 are reduced, thus reducing the number of required devices. However, since only examination of a single electrode is performed at one time, an examination speed becomes low.

Moreover, after examining the electrodes for defects using frequency characteristics, the present invention may perform more detailed examination using a vision system with respect to only defective PDP electrodes. If the electrode examination is performed according to the present invention, approximate positions and lengths of defective electrodes can be detected. Therefore, only the surroundings of the detected defective electrodes are examined using the vision system without examining the entire PDP. Consequently, a high speed line scan camera is not required, and an examination time, which was increased in proportion to the increase of the PDP size in the prior art, can be shortened. That is, the examination apparatus of the present invention and the vision system are combined, thus solving the problems of expensive equipment and data processing encountered when only the vision system is used.

Figure 13B:
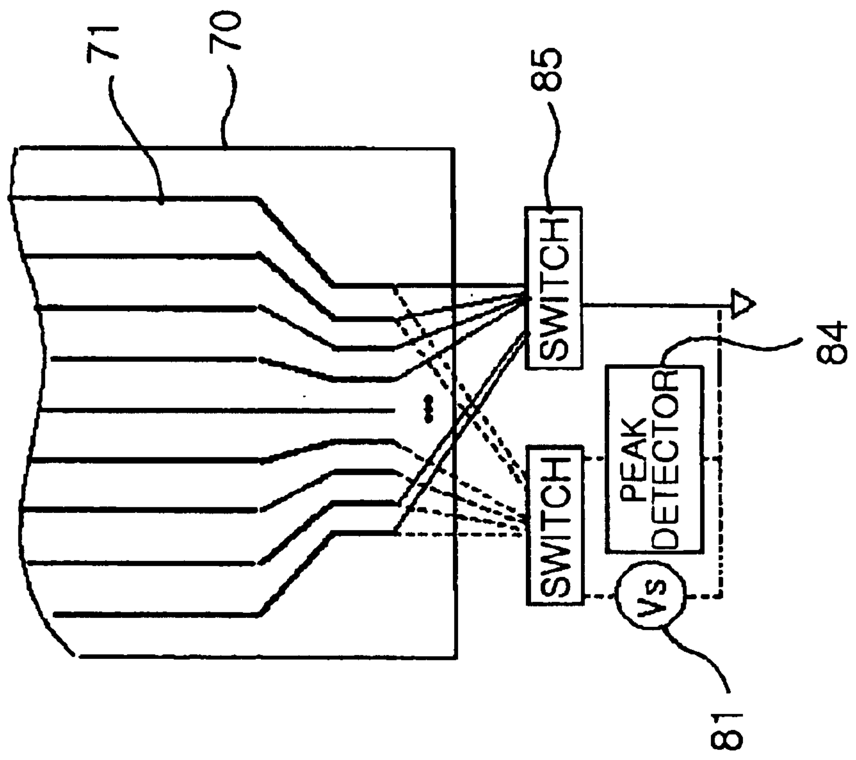
FIGS. 13A and 13B are views showing other examples of a structure for examining PDP electrodes according to the present invention.
Figure 13A:
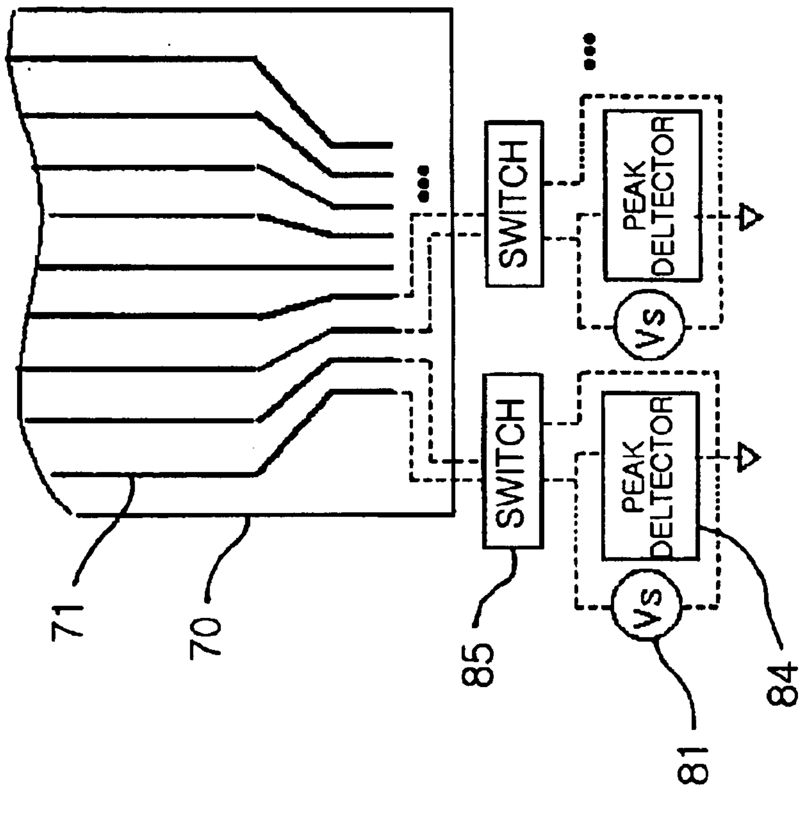

In the case where two parallel electrodes are used as a signal line and a ground line, respectively, without using a ground plane, signals must be directly applied to respective electrodes to measure output waves, as shown in FIGS. 13A and 13B.

In an embodiment of FIG. 13A, one of signal generators 81 and one of peak detectors 84 are connected to two randomly selected electrodes (signal electrode and ground electrode), respectively. Further, which operations the pair of electrodes 71 will perform is determined through a switch 85. In this case, operations vary with respect to the pair of electrodes 71, so examinations are carried out two times with respect to the pair of electrodes 71, thus examining the electrodes for defects.

Next, an embodiment of FIG. 13B is constructed so that a plurality of electrodes are examined using one signal generator 81 and one peak detector 84. That is, one signal generator 81 and one peak detector 84 are provided and two switches 85 are controlled, so that a signal terminal and a ground terminal of the switches 85 are connected to two randomly selected among the plural electrodes, respectively. At this time, one pair of electrodes are examined at once according to the operations of the switches 85. Therefore, the number of devices decreases, but an examination speed may decrease.

As described above, the present invention provides a method and apparatus for examining PDP electrodes using frequency characteristics, which reduces an examination time relative to a conventional PDP examination method or apparatus using a vision system, thus improving efficiency of examination to comply with a trend toward large-sized PDP and a great demand for PDPs. Further, the present invention is advantageous in that there is no need to process large-capacity data, differently from the conventional vision system, thus enabling the examination apparatus to be inexpensively constructed. Further, the present invention is advantageous in that, even though the size of a target PDP increases, additional hardware is not required and an examination time hardly increases.

The PDP electrode examination method and apparatus using the measurement of frequency characteristics according to the present invention as described above can be applied to all transmission line structures with stubs, as well as PDP electrodes, it can easily examine communication lines for defects and detect the positions thereof, and it can be extended and applied to the examination of patterns on a printed circuit board.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of examining electrodes of a Plasma Display Panel (PDP) using frequency characteristics, the PDP being constructed so that upper and lower panels, on which a plurality of electrodes are horizontally or vertically printed, are combined with each other, comprising the steps of:

a) converting target PDP electrodes printed on each of the panels to a transmission line structure;

b) applying an examination signal with a plurality of frequencies to the target PDP electrodes converted to the transmission line structure and then detecting amplitudes and phases according to frequencies of an examination signal overlapped with a reflection wave reflected from a first end of a corresponding PDP electrode; and c) determining whether the target PDP electrodes are defective by analyzing the detected amplitude and phase characteristics according to frequencies.

2. The PDP electrode examination method according to claim 1, wherein the step a) comprises the steps of:

attaching a conduction plate to a surface of the panel opposite to a surface on which the target PDP electrodes are printed; and grounding the attached conduction plate to form a ground plane.

3. The PDF electrode examination method according to claim 1, wherein the step a) comprises the steps of:

forming an impedance adjustment layer made of dielectric material on a surface of the panel on which the target PDP electrodes are formed;

attaching a conduction plate to a bottom of the impedance adjustment layer; and grounding the conduction plate and using the conduction plate as a ground plane.

4. The PDF electrode examination method according to claim 1, wherein the step a) is performed so that the panel on which the target PDP electrodes are printed is floated on an electrically conductive liquid with high specific gravity to allow a surface of the panel on which the PDP electrodes are printed to face upward, and the liquid is used as a ground plane, thus converting the PDP electrodes to the transmission line structure.

5. The PDP electrode examination method according to claim 1, wherein the step a) is performed so that two neighboring PDP electrodes are set to each electrode pair with respect to the target PDP electrodes, and a first electrode of the electrode pair is set to a target electrode and a second electrode thereof is grounded according to set electrode pairs, thus coclrerting the target PDP electrodes to the transmission line structure.

6. The PDP electrode examination method according to claim 1, wherein the step b) comprises the steps of:

b1) providing a conduction line to commonly come into contact with the plural target PDP electrodes printed on a single panel;

b2) applying an examination signal to a first end of the conduction line; and b3) detecting frequency and phase characteristics of a signal output from a second end of the conduction line opposite to the first end to which the examination signal is applied, wherein the plurality of target PDP electrodes are simultaneously examined.

7. The PDF electrode examination method according to claim 1, wherein the step b) is performed so that an examination signal is applied to a first end of each of the plurality of target PDP electrodes, and, simultaneously, frequency and phase characteristics of an output wave are detected through the first end thereof to which the examination signal is applied.

8. The PDP electrode examination method according to claim 1, wherein the examination signal applied at the step b) includes a plurality of frequency signals having a frequency interval (Δf), which is indicated in the following equation:

$$\Delta f = \frac{\Delta L}{4L(L - \Delta L)} \cdot \frac{c}{\sqrt{\varepsilon_r}}$$

where L is a length of a PDP electrode, ΔL is a length variation of the PDP electrodes to be discriminated, c is a propagation speed of light, and $\epsilon_r$ is relative permittivity of a dielectric material forming a transmission line.

9. The PDP electrode examination method according to claim 1, wherein the step c) is performed so that positions of minimum points are checked from frequency characteristic results detected at the step b), and it is determined that defects are generated on the PDP electrodes if the checked positions of the minimum point minimum points are different from those of minimum points previously set in a normal state.

10. The PDP electrode examination method according to claim 1, wherein the step c) is performed so that positions of defective electrodes are detected using frequencies having minimum points obtained from the frequency characteristic results detected at the step b).

11. The PDP electrode examination method according to claim 1, wherein the step c) is performed so that the number of defective electrodes is determined using the number of minimum points obtained from the frequency characteristic results detected at the step b) and amplitudes at the minimum points.

12. The PDP electrode examination method according to claim 1, further comprising the step of d) adjusting impedance of the target PDP electrodes to determine a division ratio of signals branched at a branch point to the examination signal, thus adjusting examination sensitivity.

13. The PDP electrode examination method according to claim 6, wherein:

the step b1) is performed so that the conduction line is provided to allow the plurality of target electrodes to have almost the same lengths ranging from a contact point of the conduction line and the target electrodes to first ends of respective electrodes; and the step c) is performed so that it is determined whether corresponding electrodes are defective by comparing positions of minimum points at previously collected output waves of normal electrodes and the output waves of the target electrodes, converted to the transmission line structure, respectively, with each other.

14. The PDP electrode examination method according to claim 6, wherein:

the step b1) is performed so that the conduction line is provided to allow target electrodes to have linearly varying lengths ranging from a contact point of the conduction line and the target electrodes to first ends of respective PDP electrodes; and the step c) is performed so that it is determined whether corresponding electrodes are defective and positions of defective electrodes are detected by comparing patterns of output waves of normal electrodes and the output waves of the target electrodes with each other and analyzing them under the same conditions.

15. The PDP electrode examination method according to claim 12, wherein the step d) is performed so that impedance of the target PDP electrodes is adjusted by adjusting type and thickness of dielectric material of the dielectric layer and thickness of the conduction line, or by adjusting an interval between the ground plane and the PDP electrodes.

16. The PDP electrode examination method according to claim 13, further comprising the step of detecting positions of defective electrodes by examining electrodes determined to be defective at step c) using a vision system.

17. An apparatus for examining PDP electrodes using frequency characteristics, comprising:

a target Plasma Display Panel (PDP) on which target electrodes are printed and a ground plane is formed to be spaced apart from the electrodes to convert the electrodes to a transmission line structure, and to which a conduction line is attached to come into contact with all of the electrodes;

a signal generator for generating an examination signal including a plurality of frequency signals;

a first impedance converter for matching impedance between the signal generator and the conduction line of the target PDP, and transmitting the examination signal to a first end of the conduction line;

a peak detector for measuring amplitudes according to frequencies of an output wave output from a second end of the conduction line through the target electrodes; and a second impedance converter for matching impedance between the second end of the conduction line and the peak detector and transmitting the output wave to the peak detector without reflection.

18. An apparatus for examining PDP electrodes using frequency characteristics, comprising:

a target PDP on which target electrodes are printed and a ground plane is formed to be spaced apart from the electrodes to convert the electrodes to a transmission line structure;

a plurality of signal generators for generating examination signals each including a plurality of frequency signals;

a plurality of first impedance converters disposed between the signal generators and the target electrodes printed on the PDP, respectively, to apply corresponding examination signals to the respective target electrodes while matching impedance between the signal generators and the target electrodes;

a plurality of peak detectors for measuring amplitudes according to frequencies of respective output waves output from the target electrodes printed on the PDP; and a plurality of second impedance converters disposed between the target electrodes and the peak detectors, respectively, to transmit the output waves to the peak detectors without reflection.

19. An apparatus for examining PDP electrodes using frequency characteristics, comprising:

a target PDP on which target electrodes are printed and a ground plane is formed to be spaced apart from the electrodes to convert the electrodes to a transmission line structure;

a signal generator for generating an examination signal including a plurality of frequency signals;

a first impedance converter disposed between the signal generator and the target electrodes printed on the PDP to transmit the examination signal to the target electrodes without reflection;

a peak detector for measuring amplitudes according to frequencies of output waves output from the target electrodes printed on the PDP;

a second impedance convertor disposed between the target electrodes and tile peak detector to transmit the output waves to the peak detector without reflection; and a switch for connecting both the first and second impedance convertors to one selected among the plurality of target electrodes.

20. An apparatus for examining PDP electrodes using frequency characteristics, comprising:

a target PDP on which a plurality of target electrodes are printed;

one or more switches respectively connected to adjacent electrodes printed on the PDP to alternately connect a corresponding electrode to first and second selection terminals of each of the switches, the second selection terminal being grounded;

one or more signal generators for generating examination signals each including a plurality of frequency signals, the signal generators being connected to first selection terminals of the switches, respectively;

one or more first impedance converters disposed between the signal generators and the target electrodes to transmit the examination signals to the target electrodes without reflection;

one or more peak detectors connected to the first selection terminals of the switches to measure amplitudes according to frequencies of output waves of the target electrodes, input through a corresponding switch; and one or more second impedance converters disposed between the target electrodes and the peak detector to transmit the output waves to the peak detector without reflection.

* * * * *